(12) United States Patent
Weaver et al.

(10) Patent No.: US 9,840,765 B2
(45) Date of Patent: Dec. 12, 2017

(54) SYSTEMS AND METHOD OF COATING AN INTERIOR SURFACE OF AN OBJECT

(71) Applicant: General Electric Company, Schenectady, NY (US)

(72) Inventors: Scott Andrew Weaver, Ballston Lake, NY (US); Dennis Michael Gray, Delanson, NY (US)

(73) Assignee: General Electric Company, Niskayuna, NY (US)

( * ) Notice: Subject to any disclaimer, the term of this patent is extended or adjusted under 35 U.S.C. 154(b) by 1034 days.

(21) Appl. No.: 14/055,049

(22) Filed: Oct. 16, 2013

(65) Prior Publication Data
US 2015/0101925 A1 Apr. 16, 2015

(51) Int. Cl.
C23C 14/32 (2006.01)
H01J 37/34 (2006.01)
C23C 14/04 (2006.01)
H01J 37/32 (2006.01)

(52) U.S. Cl.
CPC .......... *C23C 14/325* (2013.01); *C23C 14/046* (2013.01); *H01J 37/32055* (2013.01); *H01J 37/3266* (2013.01); *H01J 37/32394* (2013.01)

(58) Field of Classification Search
CPC .................. C23C 14/046; C23C 14/325; H01J 37/32055; H01J 37/32394; H01J 37/3266
USPC ........................................ 204/192.38, 298.41
See application file for complete search history.

(56) References Cited

U.S. PATENT DOCUMENTS

| | | |
|---|---|---|
| 2,106,004 A | 1/1938 | Inglee |
| 3,566,184 A | 2/1971 | Clifford |
| 3,586,905 A | 6/1971 | Bignell |
| 4,277,304 A | 7/1981 | Horiike et al. |
| 4,468,309 A * | 8/1984 | White ............... C23C 14/32 204/192.15 |
| 4,512,867 A | 4/1985 | Andreev et al. |
| 4,661,682 A | 4/1987 | Gruner et al. |
| 4,970,364 A | 11/1990 | Muller |

(Continued)

FOREIGN PATENT DOCUMENTS

CN 102345101 A 2/2012
JP 2008223105 A 9/2008

OTHER PUBLICATIONS

Machine Translation JP 2008-223105 dated Sep. 2008.*

(Continued)

*Primary Examiner* — Rodney McDonald
(74) *Attorney, Agent, or Firm* — Pabitra K. Chakrabarti

(57) ABSTRACT

A system for use in coating an interior surface of an object is provided. The system includes a vacuum chamber enclosure defining an interior configured to receive the object, and a cathode coupled to the vacuum chamber enclosure. The cathode is fabricated from a coating material and has an outer surface. The cathode is configured such that when a current is applied to the cathode, an arc is formed on the outer surface and the coating material is removed from the cathode to form a cloud of coating material. The system also includes a collimator configured to be positioned between the cathode and the object configured to focus the cloud into a beam of coating material and to direct the beam towards the object, and a magnet configured to alter a path of the beam such that the beam is directed towards the interior surface of the object.

19 Claims, 4 Drawing Sheets

(56) References Cited

U.S. PATENT DOCUMENTS

| | | | |
|---|---|---|---|
| 5,045,166 A | 9/1991 | Bobbio | |
| 6,193,853 B1* | 2/2001 | Yumshtyk | C23C 14/046 204/192.12 |
| 6,706,157 B2 | 3/2004 | Boxman et al. | |
| 6,800,383 B1 | 10/2004 | Lakhotkin et al. | |
| 7,879,203 B2 | 2/2011 | Weaver et al. | |
| 2002/0074226 A1* | 6/2002 | Murakami | H01J 37/32055 204/298.41 |
| 2003/0094366 A1 | 5/2003 | Inaba et al. | |
| 2006/0198903 A1* | 9/2006 | Storey | A01N 59/16 424/618 |
| 2008/0138529 A1 | 6/2008 | Weaver et al. | |
| 2009/0291234 A1* | 11/2009 | Suzuki | C23C 14/0605 427/577 |

OTHER PUBLICATIONS

International Search Report and Written Opinion issued in connection with corresponding PCT Application No. PCT/US2014/060409 dated Nov. 28 2014.

* cited by examiner

SYSTEMS AND METHOD OF COATING AN INTERIOR SURFACE OF AN OBJECT

BACKGROUND

The present disclosure relates generally to physical vapor deposition and, more specifically, to a system and methods for applying a coating directly to an interior surface of an object via cathodic arc deposition.

At least some known physical vapor deposition processes vaporize and deposit a target material onto surfaces of a workpiece to form a coating thereon. For example, in physical vapor deposition processes such as cathodic arc deposition, current may be supplied to, and an electric arc maybe struck on a face of a target cathode to vaporize the target material from the face of the cathode. The vaporization of the cathode forms a cloud of highly ionized material that substantially fills an interior of a vacuum chamber. The coating is then formed on the workpiece by allowing the cloud to contact exposed surfaces thereof.

Generally, vaporization of a cathode in a vacuum environment forms a substantially uniform coating on the exposed surfaces of the workpiece. More specifically, at least some of the surfaces of the workpiece may be shielded such that only the exposed surfaces receive a coating thereon. However, the cloud of coating material will also deposit on an interior surface of the vacuum chamber. Cathodic arc deposition is also a line-of-sight process that enables only surfaces exposed to the cloud of coating material to receive a coating thereon. As such, it has become increasingly important to make efficient use of vaporized coating material, and to ensure that the coating material deposits on hard-to-reach surfaces of a workpiece, such as an interior surface.

BRIEF DESCRIPTION

In one aspect, a system for use in coating an interior surface of an object is provided. The system includes a vacuum chamber enclosure defining an interior configured to receive the object, and a cathode coupled to the vacuum chamber enclosure. The cathode is fabricated from a coating material and has an outer surface. The cathode is configured such that when a current is applied to the cathode, an arc is formed on the outer surface and the coating material is removed from the cathode to form a cloud of coating material. The system also includes a collimator configured to be positioned between the cathode and the object configured to focus the cloud into a beam of coating material and to direct the beam towards the object, and a magnet configured to alter a path of the beam such that the beam is directed towards the interior surface of the object.

In another aspect, a system for use in coating an interior surface of an object is provided. The system includes a vacuum chamber enclosure defining an interior configured to receive the object, and a cathode coupled to the vacuum chamber enclosure. The cathode is fabricated from a coating material and has an outer surface. The cathode is configured such that when a current is applied to the cathode, an arc is formed on the outer surface and the coating material is removed from the cathode to form a cloud of coating material. The system also includes a collimator configured to be positioned between the cathode and the object configured to focus the cloud into a beam of coating material and to direct the beam towards the object, and a positioning mechanism configured to modify an orientation of the object such that the beam is directed towards the interior surface of the object.

In yet another aspect, a method of coating an interior surface of an object is provided. The method includes providing a vacuum chamber enclosure defining an interior configured to receive the object, coupling a cathode to the vacuum chamber enclosure, the cathode fabricated from a coating material and having an outer surface. The method also includes supplying a current to the cathode to form an arc on the outer surface and remove the coating material from the cathode to form a cloud of coating material, focusing the cloud into a beam of coating material, and directing the beam towards the interior surface of the object.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to systems and methods that may be used to apply a coating directly to an interior surface of an object. In the exemplary embodiment, the system includes a vacuum chamber enclosure, a plasma deposition assembly configured to direct a beam of coating material towards the object to be coated, and means for enabling the beam to impinge against an interior surface of the object. For example, an orientation of the object may be modified and/or the path of the beam may be altered such that the coating material is directed towards and deposits on the interior surface of the object. As such, the systems described herein enable non-line of sight passages of tubular objects, for example, to receive a denser and substantially uniform coating when compared to coatings applied by other known processes.

Figure 1:
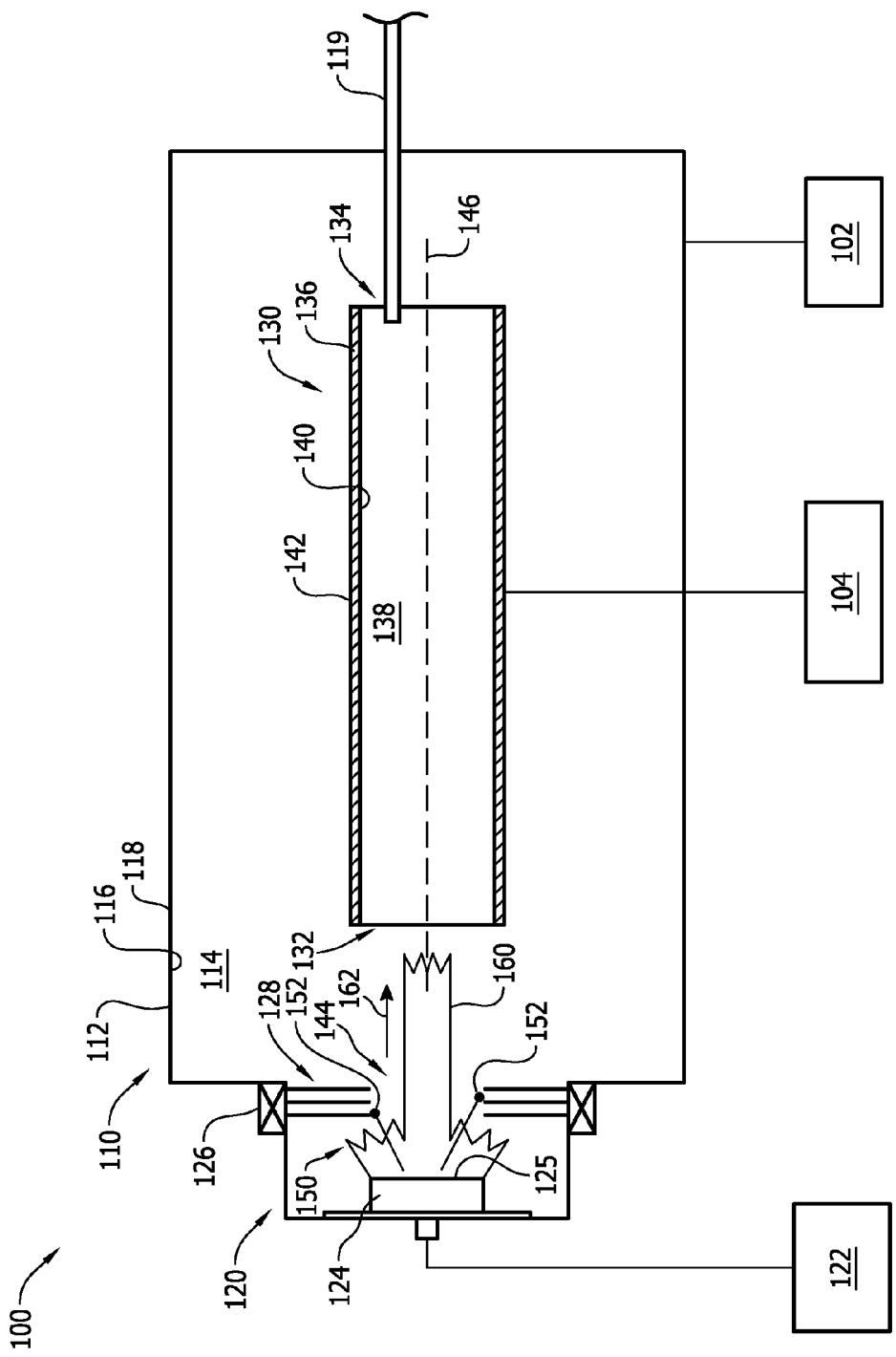
FIG. 1 is a perspective sectional illustration of an exemplary physical vapor deposition system, according to one aspect of the disclosure.

FIG. 1 is perspective sectional illustration of an exemplary physical vapor deposition system 100 for use in coating an interior surface of an object. In the exemplary embodiment, system 100 includes a vacuum system 102, a vacuum chamber enclosure 110, a plasma deposition assembly 120, and a power supply 122. Vacuum chamber enclosure 110 includes a wall 112, an interior 114, an interior surface 116 of wall 112, and an outer surface 118 of wall 112. Vacuum system 102 is coupled to vacuum chamber enclosure 110 and facilitates creating a vacuum within vacuum chamber enclosure 110. In one embodiment, vacuum system 102 may evacuate interior 114 to a pressure of between about $10^{-4}$ torr and about $10^{-5}$ torr during operation of plasma deposition assembly 120. In an alternative embodiment, interior 114 is evacuated to any pressure that enables system 100 to function as described herein. Further, in an alternative implementation, vacuum chamber enclosure 110 operates at a partial pressure atmosphere of reactive gas.

An object 130 is positioned within interior 114 such that plasma deposition assembly 120 may deposit a coating thereon. In the exemplary embodiment, object 130 has a substantially cylindrical shape and includes a first open end 132, a second open end 134, and a side wall 136 extending therebetween. Object 130 also includes an interior 138, an interior surface 140 of wall 136, and an exterior surface 142 of wall 136. In an alternative embodiment, object 130 may have any shape that enables system 100 to function as described herein.

Plasma deposition assembly 120 includes a cathode 124, a collimating magnet 126, and an optical filter 128. Cathode 124 is fabricated from any coating material that enables plasma deposition assembly 120 to function as described herein. Exemplary coating materials include, but are not limited to, a metallic alloy material, an intermetallic material, and/or an elemental metal. Alternatively, cathode 124 is fabricated from more than one coating material. Moreover, in the exemplary embodiment, an anode for the anode/cathode electric circuit is wall 112 of vacuum chamber enclosure 110. In an alternative embodiment, the anode is any component of system 100 that enables plasma deposition assembly 120 to function as described herein.

Collimating magnet 126 and optical filter 128 are positioned axially between cathode 124 and object 130. Collimating magnet 126 is coupled to vacuum chamber enclosure 110 and extends circumferentially about outer surface 118 of vacuum chamber enclosure 110. Optical filter 128 is coupled to interior surface 116 of wall 112 and extends circumferentially within interior 114 of vacuum chamber enclosure 110. Optical filter 128 has a substantially annular shape such that a passage 144 defined therein enables coating material to be directed towards object 130.

In operation, a vacuum is drawn in interior 114 of vacuum chamber enclosure 110, and power supply 122 supplies current to cathode 124 to form a difference in electric potential between cathode 124 and the anode. As such, an electric arc (not shown) is struck on an outer surface 125 of cathode 124 by an igniter (not shown), and the current supplied to cathode 124 facilitates vaporizing the coating material to remove the coating material therefrom. More specifically, vaporizing the coating material facilitates forming a cloud 150 of coating material. Power supply 122 may supply any current that enables plasma deposition assembly 120 to function as described herein. For example, the amount of current supplied is selected based on the coating material used to fabricate cathode 124 and/or a desired rate of vaporization of the coating material. In an alternative embodiment, a gas line 119 channels reactive gas into interior 138 to facilitate coating interior surface 140 of object 130. More specifically, the reactive gas reacts with cloud 150 to form a coating on interior surface 140. The reactive gas may include, but is not limited to, nitrogen.

Collimating magnet 126 is configured to focus cloud 150 into a beam 160 of coating material. More specifically, a magnetic field generated by collimating magnet 126 interacts with charged ions contained in cloud 150 of coating material to focus cloud 150 into beam 160. Collimating magnet 126 is also configured to direct beam 160 towards interior surface 140 of object 130 to facilitate forming a coating (not shown) on interior surface 140. For example, beam 160 is directed through passage 144 and towards interior surface 140 of object 130.

In some embodiments, supplying current to cathode 124 facilitates forming globules 152 of molten coating material that may facilitate reducing the integrity of the coating on interior surface 140 if deposited thereon. Optical filter 128 is positioned between cathode 124 and object 130 to facilitate restricting globules 152 of molten coating material from being ejected from cathode 124 towards object 130. Globules 152 do not have a magnetic charge such that their trajectory is unaffected by the magnetic field generated by collimating magnet 126. As such, optical filter 128 is configured such that globules 152 impinge against optical filter 128.

System 100 also includes a positioning mechanism 104 coupled to object 130. Positioning mechanism 104 facilitates modifying an orientation of object 130 in at least one axis such that beam 160 impinges directly against interior surface 140 of object 130. More specifically, as depicted, a path 162 of beam 160 is substantially aligned with a longitudinal axis 146 of object 130. As such, beam 160 is directed through first open end 132, interior 138, and second open end 134 to impinge against interior surface 116 of wall 112. In some embodiments, positioning mechanism 104 is also an electrical connection that supplies a voltage bias to object 130 relative to the electric potential of cathode 124. The voltage bias may vary as a function of desired characteristics of the coating to be provided on object 130.

In operation, positioning mechanism 104 modifies the orientation of object 130 such that longitudinal axis 146 of object 130 is obliquely oriented relative to path 162 of beam 160. As such, beam 160 is directed through first open end 132 to impinge against interior surface 140 of object 130 to form a coating (not shown) thereon. Positioning mechanism 104 may orient object 130 such that longitudinal axis 146 has any angle relative to path 162 that enables system 100 to function as described herein. For example, the degree of angling object 130 that enables beam 160 to impinge against interior surface 140 is based on the size and/or shape of first open end 132.

Positioning mechanism 104 may also modify the orientation of object 130 by translating object 130 either towards or away from plasma deposition assembly 120. Translating object 130 enables beam 160 to impinge against interior surface 140 at different axial locations along longitudinal axis 146 of object 130. As such, a coating having a substantially uniform thickness is formed along interior surface 140.

Figure 2:
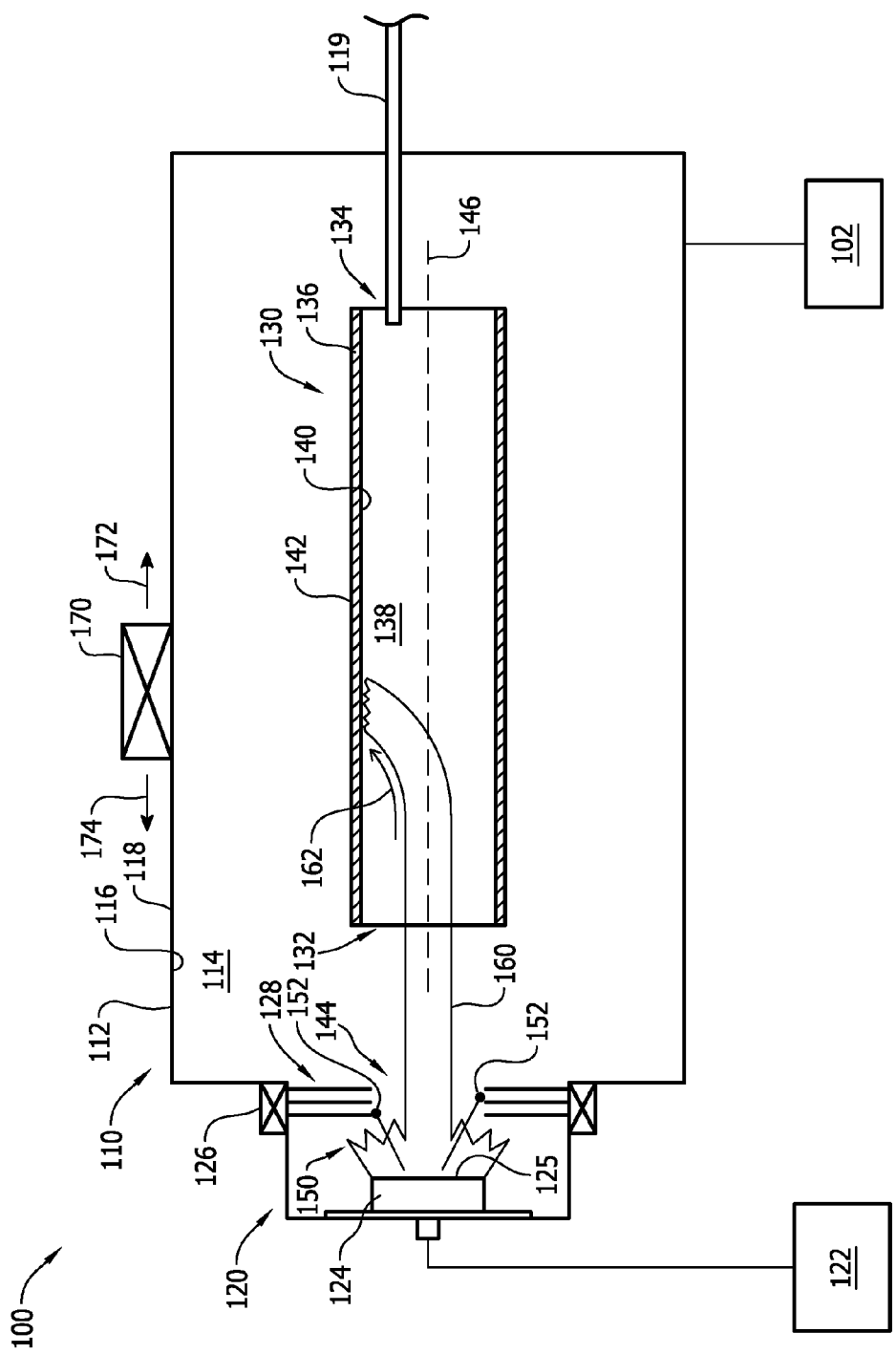
FIG. 2 is a perspective sectional illustration of an alternative physical vapor deposition system, according to one aspect of the disclosure.
Figure 3:
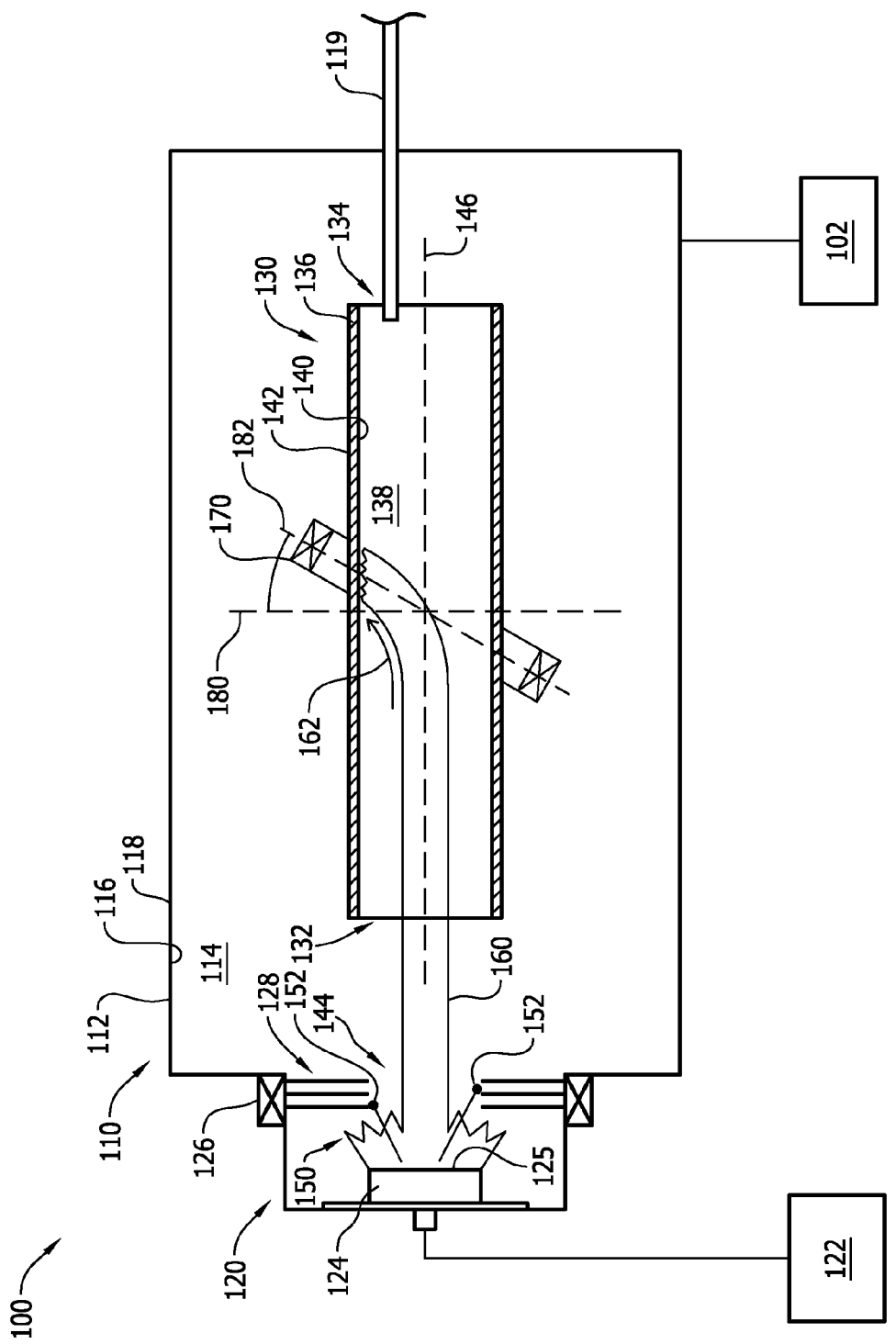
FIG. 3 is a perspective sectional illustration of an alternative physical vapor deposition system, according to one aspect of the disclosure.
Figure 4:
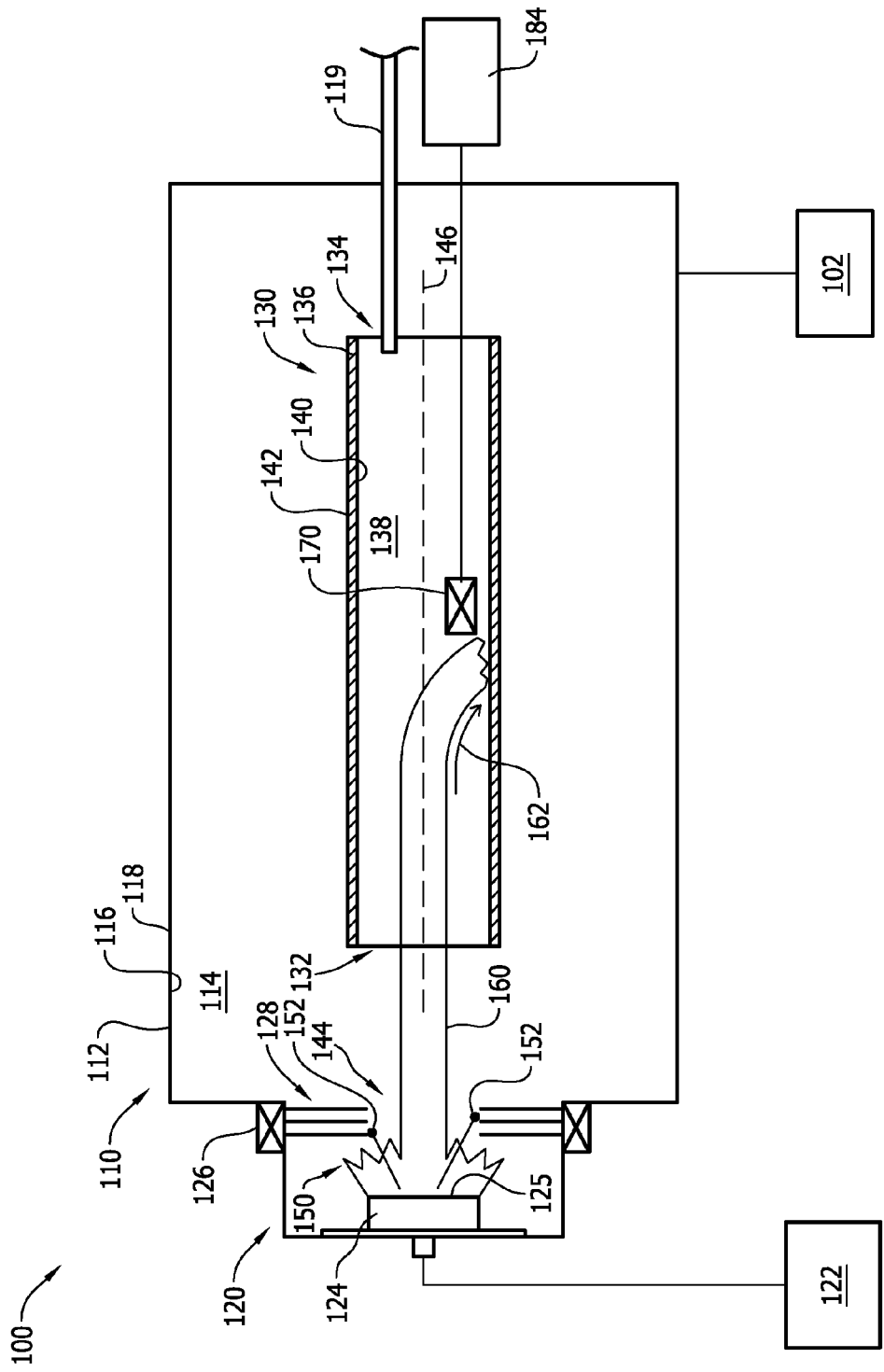
FIG. 4 is a perspective sectional illustration of an alternative physical vapor deposition system, according to one aspect of the disclosure.

FIGS. 2-4 are perspective sectional illustrations of physical vapor deposition system 100, according to other aspects of the disclosure. In the exemplary embodiments, system 100 includes a magnet 170 that alters path 162 of beam 160 such that beam 160 is directed towards interior surface 140 of object 130. More specifically, a magnetic field generated by magnet 170 interacts with charged ions contained in beam 160 such that beam 160 is directed towards interior surface 140 without having to modify the orientation of object 130. As such, beam 160 is directed through first open end 132 of object 130 and into interior 138 to impinge directly against interior surface 140. In an alternative embodiment, magnet 170 and positioning mechanism 104 (shown in FIG. 1) is used in combination to direct beam 160 towards interior surface 140 of object 130.

Referring to FIGS. 2 and 3, magnet 170 generates a magnetic field that attracts the coating material of beam 160 towards magnet 170 to alter path 162 of beam 160. In the exemplary embodiments, magnet 170 is positioned exterior of object 130. More specifically, referring to FIG. 2, magnet 170 is coupled to outer surface 118 of vacuum chamber enclosure 110. As such, in operation, magnet 170 is translated in either a first direction 172 or a second direction 174 such that beam 160 impinges against interior surface 140 at different axial locations along longitudinal axis 146.

Magnet 170 is positioned externally of vacuum chamber enclosure 110 to facilitate increasing the effectiveness of magnet 170. For example, by positioning magnet 170 externally of vacuum chamber enclosure 110, magnet 170 does not become coated with material during operation, magnet 170 remains cool, and the size of magnet 170 is not restricted by the space provided by interior 114 of vacuum chamber enclosure 110. Using a larger magnet 170 enables the path 162 of beam 160 to be altered more easily than with a smaller magnet.

Referring to FIG. 3, magnet 170 is within interior 114 of vacuum chamber enclosure 110 and positioned about object 130. More specifically, in the exemplary embodiment, magnet 170 has a substantially annular shape and extends circumferentially about exterior surface 142 of object 130. Magnet 170 may then be angled relative to an axis 180 to modify path 162 of beam 160. For example, an angle θ between axis 180 and an axis 182 of magnet 170 is less than about 90°. Moreover, magnet 170 is translated relative to longitudinal axis 146 of object 130 such that beam 160 impinges against interior surface 140 at different axial locations along longitudinal axis 146.

Referring to FIG. 4, magnet 170 generates a magnetic field that draws the ionized coating material of beam 160 towards magnet 170 to modify path 162 of beam 160. In the exemplary embodiment, magnet 170 is a permanent magnet positioned within interior 138 of object 130. System 100 also includes a second positioning mechanism 184 coupled to magnet 170. Second positioning mechanism 184 modifies an orientation of magnet 170 to alter path 162 of beam 160 such that beam 160 impinges against interior surface 140 at different axial locations along longitudinal axis 146. For example, second positioning mechanism 184 may translate magnet 170 at different axial locations along longitudinal axis 146 and/or may orient magnet 170 to be misaligned from longitudinal axis 146. In an alternative embodiment, magnet 170 is an electromagnet.

The systems and methods described herein enable a coating to be directly applied to an interior surface of an object using a physical vapor deposition process. For example, an orientation of the object may be modified and/or a path of a beam of coating material may be modified such that the coating material is directed towards and deposits on the interior surface of the object. More specifically, the path of the beam may be modified by generating a magnetic field that interacts with the charged ions contained in the beam of vaporized coating material. As such, embodiments of the present disclosure enable interior surfaces of an object to be coated with material.

An exemplary technical effect of the methods, systems, and assembly described herein includes at least one of (a) enabling a coating to be applied to hard-to-reach interior surfaces of an object; (b) reducing manufacturing costs by directing the coating material directly onto an interior surface of the object; and (c) applying a coating having improved mechanical characteristics compared to coatings applied by other known processes.

Exemplary embodiments of the physical vapor deposition system are described above in detail. The physical vapor deposition system is not limited to the specific embodiments described herein, but rather, components of systems and/or steps of the methods may be utilized independently and separately from other components and/or steps described herein. For example, the physical vapor deposition system may also be used in combination with other physical vapor deposition processes, and are not limited to practice with only the physical vapor deposition process and methods as described herein. Rather, the exemplary embodiment can be implemented and utilized in connection with many applications where coating the inside of an object is desirable.

Although specific features of various embodiments of the present disclosure may be shown in some drawings and not in others, this is for convenience only. In accordance with the principles of embodiments of the present disclosure, any feature of a drawing may be referenced and/or claimed in combination with any feature of any other drawing.

This written description uses examples to disclose the embodiments of the present disclosure, including the best mode, and also to enable any person skilled in the art to practice embodiments of the present disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for use in coating an interior surface of an object, said system comprising:
    a vacuum chamber enclosure defining an interior configured to receive the object;
    a cathode coupled to said vacuum chamber enclosure, said cathode fabricated from a coating material and having an outer surface, said cathode configured such that when a current is applied to said cathode, an arc is formed on said outer surface and the coating material is removed from said cathode to form a cloud of coating material;
a collimator configured to be positioned between said cathode and the object, said collimator configured to focus the cloud into a beam of coating material and to direct the beam towards the object in a downstream direction and through an open end of the object; and
a magnet configured to alter a path of the beam such that a portion of the beam directed through the open end of the object in the downstream direction is redirected in a different direction towards the interior surface of the object.

2. The system in accordance with claim 1, wherein said magnet is configured to direct the path of the beam through an open end of the object and into an interior of the object.

3. The system in accordance with claim 1, wherein an orientation of said magnet is configured to be modified such that the beam impinges against the interior surface of the object at different axial locations along a longitudinal axis of the object.

4. The system in accordance with claim 1, wherein said magnet is configured to attract the coating material to alter the path of the beam such that the beam impinges against the interior surface of the object.

5. The system in accordance with claim 4, wherein said magnet is positioned exterior of the object.

6. The system in accordance with claim 4, wherein said magnet is positioned exterior of said vacuum chamber enclosure.

7. The system in accordance with claim 1, wherein said magnet is configured to repel the coating material to alter the path of the beam such that the beam impinges against the interior surface of the object.

8. The system in accordance with claim 7, wherein said magnet is positioned within an interior of the object.

9. The system in accordance with claim 1 further comprising a filter positioned between said cathode and the object, said filter configured to restrict molten coating material from being ejected from said cathode towards the object.

10. A method of coating an interior surface of an object, said method comprising:
providing a vacuum chamber enclosure defining an interior configured to receive the object;
coupling a cathode to the vacuum chamber enclosure, the cathode fabricated from a coating material and having an outer surface;
supplying a current to the cathode to form an arc on the outer surface and remove the coating material from the cathode to form a cloud of coating material;
focusing the cloud into a beam of coating material that is directed in a downstream direction and through an open end of the object; and
using a magnet to alter a path of the beam such that a portion of the beam directed through the open end of the object in the downstream direction is redirected in a different direction towards the interior surface of the object.

11. The method in accordance with claim 10, wherein directing the beam towards the interior surface of the object comprises directing the beam through an open end of the object to impinge against the interior surface of the object.

12. The method in accordance with claim 10, wherein directing the beam towards the interior surface of the object comprises modifying an orientation of the object such that the beam impinges against the interior surface of the object.

13. The method in accordance with claim 10, wherein directing the beam towards the interior surface of the object comprises altering a path of the beam such that the beam impinges against the interior surface of the object.

14. The method in accordance with claim 13, wherein modifying a path of the beam comprises generating a magnetic field to interact with charged ions contained in the beam of coating material.

15. The method in accordance with claim 14, wherein generating a magnetic field comprises configuring the magnetic field to one of attract or repel the beam towards the interior surface of the object.

16. A method of coating an interior surface of an object, said method comprising:
providing a vacuum chamber enclosure defining an interior configured to receive the object;
coupling a cathode to the vacuum chamber enclosure, the cathode fabricated from a coating material and having an outer surface;
supplying a current to the cathode to form an arc on the outer surface and remove the coating material from the cathode to form a cloud of coating material;
focusing the cloud into a beam of coating material that is directed in a downstream direction and through an open end of the object; and
modifying an orientation of the object, translationally relative to the cathode, and rotationally, such that the beam is directed through the open end of the object and impinges against the interior surface of the object at different axial locations relative to a longitudinal axis of the object.

17. The method in accordance with claim 16, wherein modifying an orientation of the object comprises modifying the orientation of the object such that the longitudinal axis extending through the object is obliquely oriented relative to a path of the beam.

18. The method in accordance with claim 16, wherein modifying an orientation of the object comprises translating the object one of towards or away from the cathode.

19. The method in accordance with claim 16 further comprising using a filter to restrict molten coating material from being directed towards the object.

* * * * *